United States Patent [19]
Yakubowski

[11] Patent Number: 5,323,818
[45] Date of Patent: Jun. 28, 1994

[54] APPARATUS AND PROCESS FOR DISPENSING THERMAL PASTE INTO A THERMAL CONDUCTION MODULE COLD PLATE

[75] Inventor: Carl Yakubowski, Staatsburg, N.Y.

[73] Assignee: International Business Machines Corporation, Armonk, N.Y.

[21] Appl. No.: 54,378

[22] Filed: Apr. 28, 1993

[51] Int. Cl.$^5$ .............................................. B65B 31/02
[52] U.S. Cl. ........................... 141/7; 141/51; 141/61; 141/65; 141/67; 141/100; 141/238; 29/436
[58] Field of Search ............... 141/1.1, 4, 5, 7, 8, 141/9, 32, 51, 59, 61, 65, 67, 100, 102, 237, 238, 240-245, 325, 326; 29/436, 530; 165/80.3, 80.4, 185; 257/718, 719; 361/715

[56] References Cited

U.S. PATENT DOCUMENTS

| | | |
|---|---|---|
| 151,108 | 5/1874 | Evans . |
| 244,378 | 7/1881 | Clark ................... 141/237 |
| 332,204 | 12/1885 | Krehbiel ............... 141/238 |
| 517,300 | 3/1894 | Kidsdale ............... 184/99 |
| 581,847 | 5/1897 | Carvin . |
| 1,147,512 | 7/1915 | Kirkland .............. 141/240 |
| 1,579,947 | 4/1926 | Kilpatrick ............ 141/240 |
| 3,841,362 | 10/1974 | Haller et al. ......... 141/32 |
| 3,847,191 | 11/1974 | Aronson ............... 141/12 |
| 4,099,550 | 7/1978 | Matsuzaki et al. ..... 141/51 |
| 4,203,129 | 5/1980 | Oktay et al. ......... 165/80.4 X |
| 4,639,829 | 1/1987 | Ostergren et al. .... 165/80.4 X |
| 4,753,276 | 6/1988 | Inaba et al. .......... 141/7 |

OTHER PUBLICATIONS

IBM Technical Disclosure Bulletin, vol. 32, No. 6B, pp. 17-19-Heat Sink Assembly Tool Nov. 1989.
Research Disclosure, Apr. 1991, No. 324, Disclosure No. 32447, TCM Hat Anodization Plating Integrity Tester.

*Primary Examiner*—J. Casimer Jacyna
*Attorney, Agent, or Firm*—Aziz M. Ahsan

[57] ABSTRACT

An apparatus and method for dispensing thermally conductive paste into the blind holes of a cold plate, and the insertion of pistons into those blind holes and in engagement with and to be coated by the thermal paste is described. The thermal paste is extruded from a carrier plate into the blind holes by the pistons to form the finished assembly of the cold plate under conditions of a vacuum to eliminate entrapped air or gases, which either would expand when the cold plate assembly was positioned within a vacuum chamber of a thermally conductive module or would impede heat transfer between the piston and the cold plate.

7 Claims, 2 Drawing Sheets

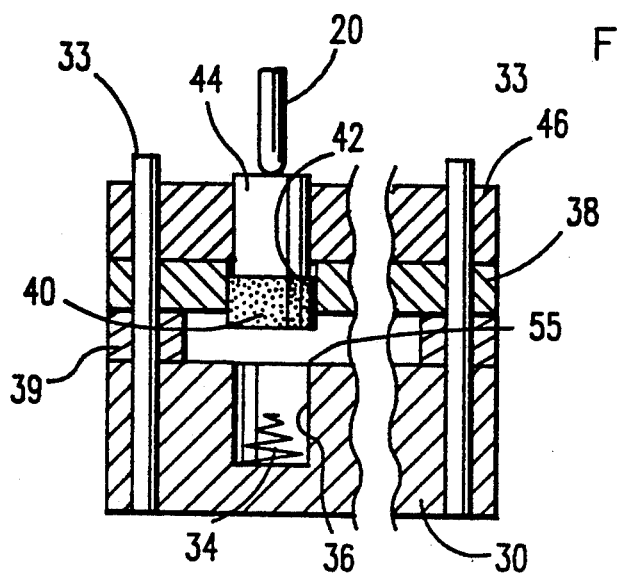
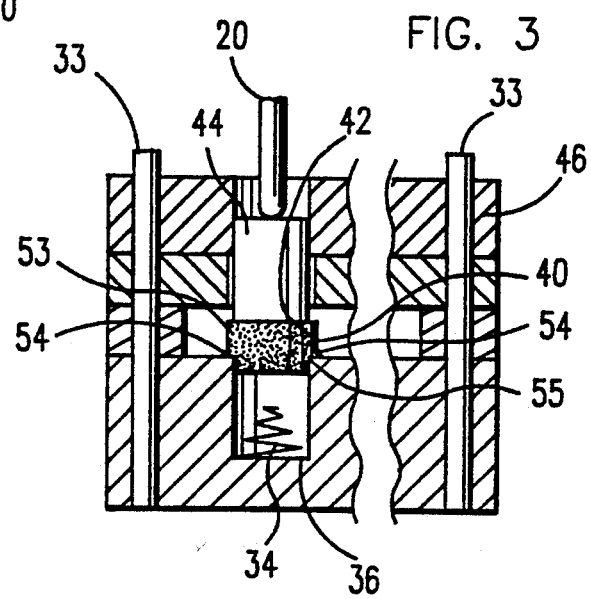
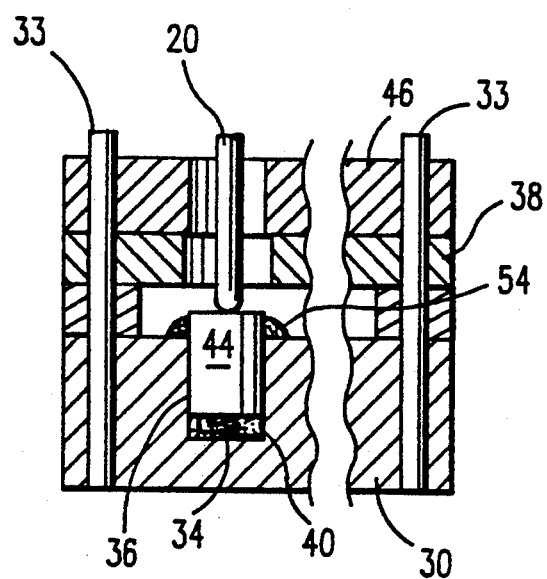

APPARATUS AND PROCESS FOR DISPENSING THERMAL PASTE INTO A THERMAL CONDUCTION MODULE COLD PLATE

FIELD OF THE INVENTION

This invention relates to the assembly of a thermal conduction module and, more specifically, the accurate dispensing of thermal paste into a thermal conduction module cold plate.

BACKGROUND OF THE INVENTION

Cold plates are used for cooling electrical components in large scale electrical devices such as computers. The cold plate typically is cooled or chilled by a flow of refrigerant, either chilled water or a super-cooled gas or liquid.

Cold plates typically are engaged in surface-to-surface contact with a planar surface of an electronic module or an electronic chip and thus serve as a heat sink for the thermal energy generated within the electronic component. The electronic devices are contained within a low level vacuum container; and accordingly, conduction is the only significant form of cooling for the electronic components. The removal of the atmosphere from the interior of the vacuum container or thermally conductive module eliminates the possibility of convection, and the resulting overheating would cause the electronic components to malfunction prior to an adequate radiant cooling temperature being obtained. Accordingly, with no convection cooling, the electronic components must be conductively engaged with a cooled heat sink. In order to assure adequate surface-to-surface contact as well as an efficient conduction path for the heat from the electronic components to the cold plate, pistons are inserted into blind holes of the cold plate such that the pistons may be urged to engage the electronic component to provide an enhanced conductive path to the cold plate. The cold plate is provided with a plurality of blind holes into which the pistons may be fitted. In order to overcome the thermal conduction resistance of the interface between the pistons and the cold plate, it has become customary to utilize a thermal paste which has a high conductivity and which will engage both the piston surfaces and the cold plate surfaces. Thereby, the thermal barrier between the cold plate and the piston is reduced, if not eliminated.

When pistons are inserted into blind holes in the cold plate together with the thermal paste, air typically is trapped within the blind hole together with the thermal paste. This creation of uneven thermal conduction from the piston to the cold plate, caused by the entrapped air, at least partially defeats the thermal conductivity of the paste layer.

Further, the inclusion of air within the assembled pistons and cold plate assembly creates further problems when the thermal conduction module is fully assembled and then evacuated. The trapped air bubbles will expand and create pressure against the piston in excess of that designed for the assembly; with leakage over time, the air will degrade the quality of the vacuum within the thermal conduction module, possibly to the point where the module will no longer function properly. Additionally, the expansion of the air bubble will increase forces by the piston onto the electronic module or chip; if large enough, these forces might damage the electronics.

OBJECTS OF THE INVENTION

It is an object of the invention to eliminate air and air bubbles from being trapped in the thermal paste within a cold plate/piston assembly.

It is another object of the invention to control precisely the quantity of paste which is inserted into the blind holes of the cold plate.

It is still another object of the invention to control the forces exerted on the pistons by the elimination of air pockets or bubbles which could subsequently expand and thereby could displace the pistons or could increase the force exerted thereon.

SUMMARY OF THE INVENTION

The foregoing objects of the invention are accomplished and the disadvantages of the prior art overcome by providing a paste carrier plate which is a plate having a plurality of holes formed extending through the plate. The paste carrier plate holes are of a precisely controlled diameter, slightly larger than the holes in a cold plate. The holes are positioned coaxially with the blind holes of a cold plate which is to be filled, at least partially, with the paste.

The paste carrier plate holes are filled with a paste which has thermally conductive properties as required for adequate thermal conduction between pistons and the cold plate. After the holes are filled with the desired quantity of paste, as determined by the thickness of the paste carrier plate, this paste will remain substantially immobile within the holes of the paste carrier plate. The paste when loaded into the paste carrier plate holes either is screeded or doctor bladed to precisely fill the entire hole. The paste carrier plate then may be positioned precisely over a cold plate which has blind holes formed therein. With the paste carrier plate holes and the blind holes coaxially in register and with the paste carrier plate spaced apart from the surface of the cold plate, the thermal paste contained within the paste carrier plate may be extruded from the holes in the carrier plate in the form of a plug. This plug of paste will be then forced, at least partially, into the blind holes of the cold plate.

A second carrier plate carrying the pistons for the cold plate assembly similarly is located with the pistons coaxially positioned over the holes of the thermal paste carrier plate. The pistons are precisely formed to have a diameter which is slightly smaller than the diameter of the blind holes of the cold plate, while at the same time being also smaller than the diameter of the holes in the thermal paste carrier plate. With the piston carrier plate, thermal paste carrier plate, and the cold plate all aligned, the piston then may be forced through the piston carrier plate and the thermal paste carrier plate, thus extruding or dislodging the plug of thermal paste and translating it to the top surface of the cold plate. At this point in its translation, around its periphery the plug will engage the edges of the cold plate which define the blind holes formed therein. As the plug is translated further in the direction of the cold plate, around the periphery of the thermal paste plugs a small portion of the thermal paste is scraped off of the thermal paste plug and will remain on the surface of the cold plate. The major portion of the thermal paste plug will be forced into the hole in the cold plate, thereby partially filling the hole in the cold plate with the thermal paste.

Prior to the displacement of the piston and the thermal paste toward the cold plate, a vacuum is drawn around the two carrier plates and the cold plate. This may be accomplished by positioning the cold plate and the two carrier plates in proper alignment within a vacuum chamber, and then drawing a vacuum within the chamber. As the vacuum is drawn, the air which occupies the blind holes within the cold plate, likewise, is evacuated and very little, if any, air will remain to be trapped by the thermal paste as it is dispensed into the blind hole. Likewise, should any small air bubbles exist within the thermal paste plug, the air bubbles entrapped within the paste will have an opportunity to expand and escape prior to the paste being dispensed into the blind holes of the cold plate.

With the thermal paste forced into the blind holes of the cold plate, it will flow and surround a conical compression spring which has been previously positioned within the blind hole. Further displacement of the piston will force the piston into the blind hole; when the hole is fully filled with the thermal paste and a portion of the piston, any further piston translation into the hole will tend to extrude a small portion of the paste out of the hole and into a bead of thermal paste formed by the extruded paste as well as the paste scraped from the thermal paste plug of the cold plate, at the surface of the cold plate and surrounding the piston. When the force is relieved on the piston, the conical spring will tend to urge the piston outwardly from the blind hole and thus will tend to aspirate some of the thermal paste back into the blind hole. The insertion of the piston into the blind hole will insure that a thin layer of the thermal paste will reside between the piston and the walls of the blind hole thereby insuring enhanced thermal conductivity through that interface.

A more complete understanding of the invention may be had by referring to the drawings and the detailed description of the best mode of the preferred embodiment to follow.

DRAWINGS

FIG. 2 is a sectional drawing of the cold plate and carrier plates in their aligned positions with the piston partially translated toward the cold plate and the thermal paste plug partially extruded from the thermal paste carrying plate.

FIG. 3 is a sectional view of the device in FIG. 2 with the thermal paste plug fully extruded from the thermal paste carrying plate and entering the blind hole of the cold plate.

FIG. 4 is a sectional view of the device of FIG. 2 with the thermal paste plug fully dispensed into the blind hole of the cold plate and the piston inserted within the hole to its desired depth.

Figure 1:
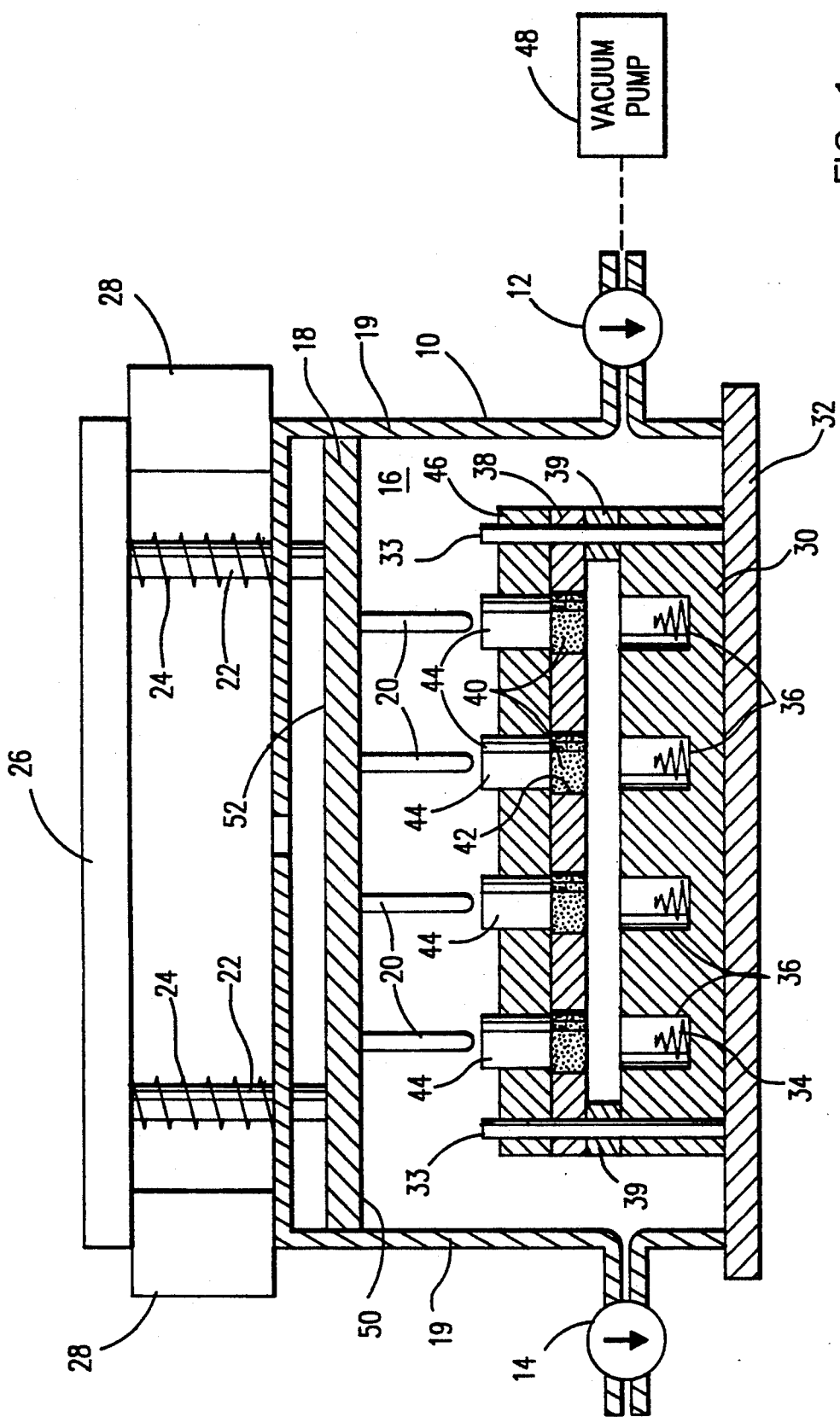
FIG. 1 is a sectional drawing of a vacuum chamber surrounding the carrier plates and cold plate.

DETAILED DESCRIPTION OF THE PREFERRED EMBODIMENT OF THE BEST MODE CONTEMPLATED BY THE INVENTORS FOR CARRYING OUT THE INVENTION

The apparatus for dispensing the thermal paste into the cold plate can be best observed and understood in FIG. 1. The apparatus comprises a vacuum chamber 10 which is provided with two valves 12, 14 formed as a part of the body of the vacuum chamber. The two valves 12, 14 are used to evacuate the atmosphere within chamber 10 and to then re-admit atmospheric air. Valve 12 may be connected to a vacuum pump 48 to evacuate the vacuum region 16 within chamber 10 while valve 14 may be used to re-admit air after the procedure of dispensing the thermal paste into the cold plate is complete.

The vacuum chamber 10 is formed having a movable ram 18 supported in a sealing relationship with the walls 19 of the chamber 10 and movable in a downward direction as viewed in FIG. 1. Ram 18 is provided with a plurality of depending appendages 20 which are engageable with the pistons 44 as will be described below.

Ram 18 is held in a retracted or raised position within the vacuum chamber 10 by means of guide rods 22 and compression springs 24. Guide rods 22 prevent the movement of ram 18 in any direction except up and down as illustrated in FIG. 1. Compression springs 24 act against retractor plate 26 to pull ram 18 upward relative to the vacuum chamber 10. When the springs 24 have extended to maximum degree possible and have retracted ram 18 to the withdrawn position, blocks 28 may be inserted between the top of vacuum chamber 10 and the underside of retractor plate 26. Blocks 28 prevent the movement of ram 18 during the time when a vacuum is being drawn within the vacuum region 16.

A cold plate 30 is positioned on or above the vacuum chamber plate 32. Cold plate 30 may be positioned on or over alignment posts 33 which will provide an accurate referencing locating member so that subsequent parts of the thermal paste dispensing apparatus are properly positioned when assembled within the vacuum region 16. Cold plate 30 is then provided with a conical coil compression spring 34 in each of the blind holes 36 of cold plate 30. In order to maintain a spaced relationship between the cold plate 30 and the thermal paste carrier plate 38, spacer collars 39 are placed around posts 33 to provide a standoff for the thermal paste carrier plate 38. Thermal paste carrier plate 38 is preloaded with thermal paste 40 by squeegeeing or doctor blading a quantity of the paste 40 into the holes 42 formed into the thermal paste carrier plate 38. The holes 42 are of precise dimensions both in terms of diameter and in thickness of the paste carrier plate 38 in order to define a predetermined accurate volume of thermal paste 40. With the holes 42 formed and filled with precision, the proper quantity of paste 40 is available for dispensing into the blind holes 36 in cold plate 30.

The thermal paste 40 provides a highly conductive filling material between the walls of blind holes 36 and pistons 44 which are located by means of the piston carrier plate 46 above and coaxially with the blind holes 36 and the holes 42 in the thermal paste carrier plate 38.

When both of the carrier plates 38, 46 and cold plate 30 are assembled in the appropriate aligned and registered position, the assembly is placed within the vacuum region 16 and the vacuum chamber 10 positioned on vacuum chamber plate 32. Thereupon a vacuum pump 48 or other suitable vacuum source is attached to valve 12, and valve 12 is opened to provide communication between region 16 and the vacuum pump 48. With valve 12 open, a vacuum will be created in the vacuum region 16. Accordingly, the atmosphere within the blind holes 36 will be withdrawn. With the reduction of pressure on the bottom face 50 of ram 18, ram 18 acts as a piston. The atmospheric pressure exerting itself on the top face 52 will act to force ram 18 downwardly in response to the reduction of pressure on face 50. Blocks 28 will impede the travel of retractor plate 26, guide rods 22 and ram 18 in a downward direction. At the time when the desired level of vacuum within chamber 16 has been attained, valve 12 may be closed to seal the vacuum chamber 16.

Blocks 28 then may be removed to permit the downward movement of ram 18 and the engagement of appendages 20 with pistons 44. The downward movement of appendages 20 will force pistons 44 downward extruding the thermal paste 40 from the holes 42 in thermal paste carrier plate 38. Further movement will displace the thermal paste 40 into the blind holes 36 within cold plate 30 as will be described, with respect to FIGS. 2, 3 and 4, in more detail. Upon the completion of the dispensing of the thermal paste 40 from thermal paste carrier plate 38 into the blind holes 36 of cold plate 30, the relief valve 14 then may be opened to admit air into the vacuum chamber 16 permitting the withdrawal of appendages 20 and ram 18 from their respectively displaced positions, under the influence of compression springs 24. With the withdrawal of ram 18 to its retracted position and the relief of the forces exerted by the vacuum in chamber 16, the vacuum chamber 10 may be removed from vacuum chamber plate 32 to facilitate removal of the completed and assembled cold plate 30 including the thermal paste 40 and the pistons 44.

For more detail of the apparatus for transference of the thermal paste 40, FIG. 2 illustrates the cold plate 30, the thermal paste carrier plate 38, and the piston carrier plate 46 in an enlarged view, wherein the appendage 20 has displaced piston 44 downward into the hole 42 in the thermal paste carrier plate 38. The mass or plug of thermal paste 40 is shown partially extruded from the hole 42 in plate 38. The hole 42 within plate 38 is larger in diameter than either blind hole 36 of cold plate 30 or piston 44. This enlarged diameter permits an annular volume of thermal paste 40 extending outwardly from the circumference of piston 44 to be forced down and to engage edge 55 which defines blind hole 36 of cold plate 30.

FIG. 3 illustrates further displacement of piston 44 and thermal paste 40. As observed in FIG. 3, the edge 55 of cold plate 30 removes a small portion of thermal paste 40 from the plug of paste 40, creating an accumulation 54 on the top surface of cold plate 30. The remainder of the plug of thermal paste 40 is being extruded into the blind hole 36 in cold plate 30. Since all of this dispensation of the thermal paste 40 occurs in a vacuum, the blind hole 36 is devoid of any gaseous matter which would act to impede the dispensing of the thermal paste 40. The accumulation of paste at 54 will serve both to lubricate and to seal the periphery of piston 44 as it translates downwardly in FIG. 3.

Referring to FIG. 4, appendage 20 is shown as withdrawn from engagement with piston 44, shown in its fully inserted position within hole 36 in cold plate 30. Conical spring 34 is compressed and completely surrounded by thermal paste 40. The accumulation 54 of paste 40 is a result of the removal of the annular region 53 of paste 40 too large in diameter to enter hole 36 as well as any paste 40 which may have been extruded out past piston 44 by the forces exerted by appendage 20. Paste accumulation 54 will act to provide a small annular reservoir of paste 40 which may be then aspirated or pulled back into the annular clearance between piston 44 and blind hole 36 as spring 34 acts to force piston 44 outward.

With the vacuum having been drawn in the vacuum chamber 10 in FIG. 1, the entrapment of air or gases in the vacuum region 16 now filled by thermal paste 40 is avoided thus eliminating any expansion forces that might be attributed to trapped gas pockets. The piston 44 may be moved by an external force a small amount further into hole 36 and will be permitted to move by extruding additional thermal paste 40 into the accumulation 54.

After the piston 44 is seated fully into blind hole 36 an the normal atmospheric pressure re-admitted into the vacuum region 16, and the appendages 20 and ram 18 withdrawn to their retracted positions, the vacuum chamber 10 may be opened and the cold plate 30 and carrier plates 38, 46 removed from the vacuum region 16. While FIGS. 2, 3 and 4 all illustrate only a single piston 44 being inserted, it should be understood that this illustration is for purposes of clarity and that multiple pistons 44 may be simultaneously inserted into cold plate 30 along with respective quantities of thermal paste 40, by means of the multiple appendages 20 on ram 18. Accordingly, a single operation of the vacuum chamber 10 and a single downward movement of ram 18 then will be effective to load multiple pistons 44 and dispense multiple quantities of thermal paste 40 into the blind holes 36 of cold plate 30.

One will appreciate that should any air pockets or bubbles be trapped in the plugs of thermal paste 40 within the thermal paste carrier plate 38, as the vacuum is drawn within vacuum region 16, the air bubbles will tend to expand and will relieve themselves into the surrounding atmosphere, thereby eliminating the air bubbles from entrapment prior to extrusion. Further, the region within blind hole 36 of cold plate 30 will be evacuated, thereby preventing the entrapment of gases or atmospheric air in that hole 36 when the plug of thermal paste 40 is dispensed into the hole 36. With the elimination of air entrapment predictability of heat transfer improves and the quality of the assembly is improved likewise.

It should be understood that other motive forces for translating the appendages 20 may be incorporated; however, the simplest and most readily available force, atmospheric pressure is used due to ready availability and simplicity of design. Mechanical devices, as well as electrical motors, could be used to drive ram 18 downward after the vacuum chamber 10 has been evacuated.

Further it should be understood that the accumulation 54 of thermal paste 40, residing in an annular form around piston 44 and in engagement with the surface of cold plate 30 should remain in place so that any movement of the piston 44, either inwardly or outwardly, from hole 36 will remain sealed. No air may be admitted between piston 44 and the interior cylindrical walls of hole 36, thereby maintaining an enhanced thermally conductive path for heat acquired by piston 44 when ultimately placed in contact with a warmed or heated electrical component.

It should be further appreciated the extreme importance of eliminating any air bubbles entrapped within the blind hole 36 and the thermal paste 40 in order to prevent those air bubbles from exerting excessive forces on piston 44 when ultimately assembled with the piston 44 engaging the electrical component, within a vacuum chamber 10.

It should be understood that minor modifications and changes may be made to the apparatus and method without departing from the scope of the claims which follow.

I claim:

1. A cold plate assembly and thermal paste dispensing apparatus for dispensing thermally conductive paste comprising:

a vacuum chamber;

a vacuum pump connected to said vacuum chamber for drawing a vacuum within said vacuum chamber;

a member having at least a surface and comprising at least one blind hole formed through said one surface and into said member;

a first plate with at least a hole extending therethrough, said plate and said hole disposed with said hole in registration with said blind hole;

a second plate with at least a hole extending therethrough, said plate and said hole disposed with said hole in registration with said hole in said first plate;

a piston disposed in said hole of said second plate;

a quantity of thermally conductive paste disposed within said hole of said first plate;

means for urging said piston toward said hole in said first plate and said blind hole to displace said paste from said hole in said first plate into said blind hole and insert said piston into said blind hole.

2. The apparatus of claim 1 wherein said means for urging comprises atmospheric pressure powered means for exerting a force on said piston.

3. The apparatus of claim 1 wherein said first plate defines at least a hole having a diametral dimension greater than a diametral dimension of said blind hole.

4. A method of accurately dispensing thermal paste into thermal conduction module cooling member comprising the steps of:

providing a vacuum chamber;

providing a thermal conduction cooling member having at least one blind hole formed therein;

providing a paste carrier comprising a plate with at least one hole formed therein extending through said plate;

providing a thermally conductive paste disposed within said hole extending through said paste carrier;

providing a piston carrier comprising a plate with at least one hole formed therein extending through said plate;

providing at least one piston;

disposing said at least one piston within said at least one hole in said piston carrier;

disposing said paste carrier and said paste, said piston carrier and said piston in registry with said at least one blind hole;

drawing a vacuum within said vacuum chamber;

displacing said piston and at least a portion of said paste from their respective carriers into said blind hole, whereby controlled amounts of a thermally conductive paste may be deposited into a thermally conductive cooling member and whereby the inclusion of air and air bubbles within said paste and said cooling member is prevented.

5. The method of claim 4 further comprising the step of:

displacing at least a portion of said paste into said blind hole and disposing a portion of said paste along the periphery of said piston and between said piston and said blind hole and displacing said piston into said blind hole.

6. The method of claim 5 comprising further step of:

providing and inserting a compression spring into said at least one blind hole, thereby providing a resilient resistance against said piston in said blind hole.

7. The method of claim 5 wherein said step of displacing is continued until a predetermined resistance to further displacement is attained.

* * * * *